United States Patent [19]

Lewicki

[11] Patent Number: 5,929,699
[45] Date of Patent: Jul. 27, 1999

[54] INTEGRATED ACTIVE INTEGRATOR FILTER WITH COMPENSATED UNITY GAIN BANDWIDTH

[75] Inventor: Laurence Douglas Lewicki, Sunnyvale, Calif.

[73] Assignee: National Semiconductor Corporation, Santa Clara, Calif.

[21] Appl. No.: 08/990,632

[22] Filed: Dec. 15, 1997

[51] Int. Cl.[6] .................................................. H03K 5/00
[52] U.S. Cl. .................. 327/552; 327/336; 327/344; 327/553; 333/172; 330/107
[58] Field of Search ........................... 327/552, 553, 327/554, 555, 556, 557, 558, 336, 341, 344, 345; 333/172; 330/107, 303, 306

[56] References Cited

U.S. PATENT DOCUMENTS 3,643,173  2/1972  Whitten ..................................... 330/107
5,166,630  11/1992 Lee ........................................... 327/554

OTHER PUBLICATIONS

"Understanding Wide–band MOS Transistors", John M. Steininger (May 1990).
"A High Performance Low Power CMOS Channel Filter", William C. Black, Jr., David J. Allstot, and Ray A. Reed, IEEE (1980).

Primary Examiner—Dinh Le
Attorney, Agent, or Firm—Limbach & Limbach LLP; Seong-Kun Oh

[57] ABSTRACT

An active RC integrator filter with finite operational amplifier bandwidth can be compensated by biasing the operational amplifier input stage such that its transconductance becomes a function of the resistance. Thereafter, by inserting another resistance of the same material in series with the integrating capacitor, a zero results in the overall transfer function of the filter according to the present invention. In this manner, the passband peaking of the active RC integrator filter resulting from the integrator phase shift can be avoided.

20 Claims, 4 Drawing Sheets

INTEGRATED ACTIVE INTEGRATOR FILTER WITH COMPENSATED UNITY GAIN BANDWIDTH

BACKGROUND OF THE INVENTION

1. Field of the Invention

The present invention relates to integrated active RC or MOSFET-Channel filters using operational amplifiers. More particularly, the present invention relates to a process independent technique which allows for gain bandwidth product of the operational amplifier to track the resistance and capacitance values.

2. Description of the Related Art

Filter designs in consumer wireless applications come in a few different forms, dependent on frequency. For instance, SAW, dielectric ceramic, and crystal filters are the most commonly used nonlumped element filters. In modern digital communications, the accuracy of the filter frequency characteristics is frequently a prolific source of product failures due to the more stringent requirements placed on their performance.

The most common cause of severe performance degradation that can be attributable to filter performance in digital communication systems is the passband frequency drift with respect to the center frequency of the filter. The passband frequency inaccuracy is usually due to the component production tolerance and thermal characteristics. Most of the digital modulation techniques are sensitive to bandlimiting phenomena. In addition, passband drifting also impairs the group delay budget for the modulation.

Elliptic filters offer the most efficiency in terms of rejection versus filter order. The problem with implementing elliptic filters is that they require precise matching of the phase response of a path comprised of two active integrators with a purely passive path which may be in the form of a feed forward capacitor. The phase errors of the active integrators move the zeros in the stop band portion of the transfer function of the filter which, in turn, causes excess peaking at the edge of the pass band.

Many communication systems, such as baseband IF processors in a cellular telephone, require the use of high order analog continuous time filters. These filters are often integrated as ladder structures which mimic the low pass band sensitivity of RLC prototype passive ladder filters.

Monolithic continuous-time filters are often active RC circuits that include amplifiers, resistors, and capacitors in a feedback configuration. The frequency response of an RC active filter depends on coefficients that are products of absolute resistance and capacitance values, both of which can be subject to considerable random variation with monolithic processing. However, ratios of resistances and ratios of capacitors remain substantially constant with process variations; therefore, ratios of RC products also remain stable.

Active RC filters can provide useful performance up to a few megahertz, but are limited by the performance and bandwidth of amplifiers as well as the parasitic effects mentioned above. Moreover, the amplifiers consume power and limit the dynamic range.

FIG. 1 shows a conventional active RC integrator filter with an operational amplifier 101, a feedback capacitor $C_1$, an input parasitic capacitance $C_{in}$, an input capacitor $C_2$ and resistor R. The operational amplifier 101 has a gain A(s) of $-\omega_u/s$ where $\omega_u$ is the unity gain frequency of the operational amplifier 101. The transfer characteristic of this active RC integrator filter is shown by the following expression.

$$\frac{V_{out}}{V_{in}} = \frac{-\left(C_2 S + \frac{1}{R}\right)}{(C_1 + C_2 + C_{in})S + \frac{1}{R}} \left(\frac{\omega_u}{S}\right) \quad (1)$$
$$\frac{C_1 S}{(C_1 + C_2 + C_{in})S + \frac{1}{R}} \left(\frac{\omega_u}{S}\right) + 1$$

Equation (1) can be simplified to the following expression.

$$\frac{V_{out}}{V_{in}} = \frac{-(RC_2 S + 1)}{RC_1 S + \left(\frac{S}{\omega_u}\right)[R(C_1 + C_2 + C_{in})S + 1]} \quad (2)$$

Which can be alternatively expressed as the following.

$$\frac{V_{out}}{V_{in}} = \frac{-(RC_2 S + 1)}{S^2 \left[\frac{R(C_1 + C_2 + C_{in})}{\omega_u}\right] + S \left[RC_1 + \frac{1}{\omega_u}\right]} \quad (3)$$

A reasonable assumption for practical applications is that the integrator unity gain frequency bandwidth will be much smaller than the operational amplifier unity gain bandwidth. Therefore, equation (3) can be simplified to the following expression:

$$\frac{V_{out}}{V_{in}} = \frac{-(RC_2 S + 1)}{S \left[\frac{R(C_1 + C_2 + C_{in})}{\omega_u}\left(S + \frac{C\omega_u}{C_1 + C_2 + C_{in}}\right)\right]} \quad (4)$$

If the input capacitor $C_2$ of the filter is zero, thereby displaying low pass filter characteristics, it can be shown from the above equation (4) that a non-dominant pole $\omega_{non-dominant}$ is located at a frequency defined by the following expression:

$$\omega_{non-dominant} = \omega_u \frac{C_1}{C_1 + C_{IN}} \quad (5)$$

FIG. 2 shows a bode plot of the transfer function for the active RC filter shown in FIG. 1 displaying low pass characteristics, i.e., where capacitor $C_2$ is zero. It can be seen from FIG. 2 that the active RC integrator filter has the unity gain product $1/RC_1$ at frequency f1 and the first non-dominant pole 202 at frequency f2.

FIG. 3 illustrates passband peaking of the conventional active RC integrator filter as shown in FIG. 1. The ideal filter characteristic 301 illustrates the effect of a transfer function zero located at an ideal zero frequency 303. By contrast, an actual conventional active RC integrator filter characteristic shows the passband peaking at a peaking frequency 305 whose transfer function zero is located at zero frequency 304. From FIG. 3, it can be seen that the zero frequency of a conventional filter 304 is shifted from ideal zero frequency 303. This is due to the phase shift of the operational amplifier in the integrator filter. In turn, due to the transfer function zero shifting from ideal frequency 303 to the conventional filter transfer function zero frequency 304, the conventional filter exhibits pass band edge peaking 305.

For example, in a code division multiple access (CDMA) baseband filter, the excess phase can be determined by the following expression.

$$\text{Excess Phase} = \text{ArcTan}\left[\frac{\frac{1}{RC_1}}{\omega_u \frac{C_1}{C_1 + C_{in}}}\right] \qquad (6)$$

With the CDMA baseband filter having the unity gain bandwidth $1/RC_1$ of $2\pi*660$ kHz, the gain bandwidth product $\omega_u$ at $2\pi40$ MHz, and the values of the feedback capacitance $C_1$ and the input parasitic capacitance $C_{in}$ of 8 and 0.7 picoFarads (pF), respectively, the excess phase according to the above expression is 1.03°. This excess phase, in turn, results in 2 dB of baseband edge peaking in an all pole ladder filter structure.

In ladder implementations of elliptic filters with resonant transmission zeros, the above result is worsened since the input capacitance $C_2$ is finite, resulting in a zero. Using the same values for the unity gain bandwidth $1/RC_1$, input capacitance $C_2$, feedback capacitance $C_1$, and input parasitic capacitance $C_{in}$, and the gain bandwidth product $\omega_u$, the excess phase according to equation (6) is 1.5°. This excess phase cause approximately 3 dB of baseband edge peaking in the elliptic CDMA filters.

The results above illustrate that even a single degree of excess phase for these filters as used in the communication channels, for example, in cellular phones, is sufficient to cause approximately 1 dB of peaking at the passband edge of the filter distorting the filter characteristics.

Therefore, there exists a need for filters generally, and, in particular, for continuous time applications, which can effectively cancel excess phase errors to minimize undesirable passband edge peaking.

SUMMARY OF THE INVENTION

The present invention illustrates an apparatus that uses a resistor in series with the integrating capacitor to create a zero in the integrator transfer function. The operational amplifier used in the integrator filter is designed such that its input stage transconductance is a function of another resistance that is made from the same material as the resistor used in series with the integrating capacitor. In this manner, both the operational amplifier unity gain bandwidth and the zero in the closed loop integrator filter transfer function track each other, and pole-zero cancellation is achieved which tracks process, voltage, and temperature variations in the filter transistors.

An integrated active integrator filter circuit according to one embodiment of the present invention includes an operational amplifier including an input node, an output node and a biasing node, a bias circuit including a first resistance coupled to said operational amplifier biasing node and configured to provide a bias signal; and a feedback circuit including a second resistance and a first capacitance serially coupled between said input and output nodes, wherein a ratio of said first and second resistances remains substantially constant over variations in operating conditions of said bias circuit.

These and other features and advantages of the present invention will be understood upon consideration of the following detailed description of the invention and the accompanying drawings.

DESCRIPTION OF THE PREFERRED EMBODIMENT

An operational amplifier which has a transconductance gm proportional to a resistance is known, J. Steininger, "Understanding Wide-band MOS Transistors", IEEE, Circuits and Devices, May, 1990. The bias circuit disclosed in Steininger produces a current which sets the transconductance gm of a matched transistor to be inversely proportional to the bias resistance coupled to the transistors in the bias circuit.

Figure 4:
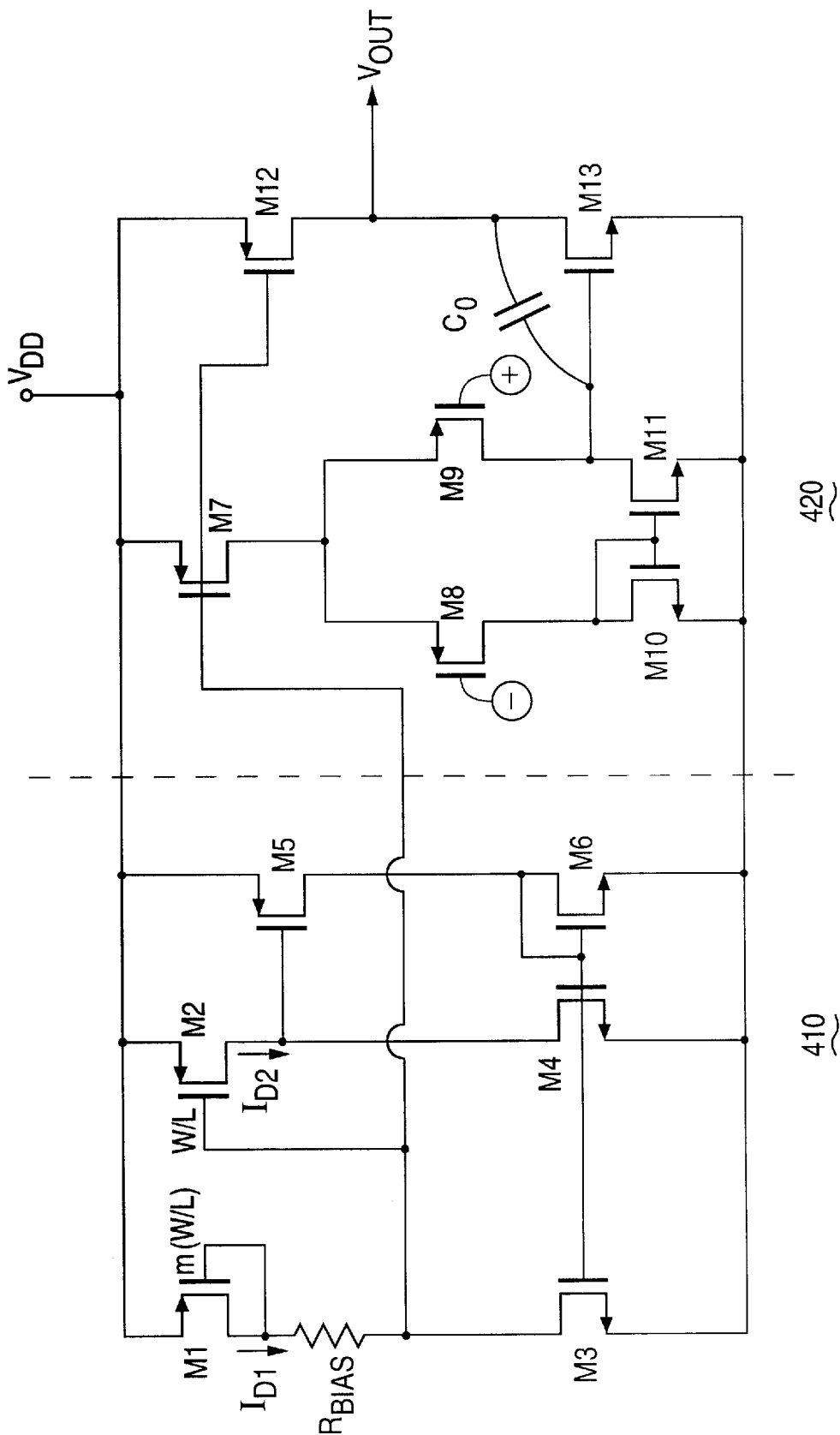
FIG. 4 illustrates a conventional bias circuit biasing an operational amplifier.

Referring to FIG. 4, a conventional bias circuit 410 biasing an operational amplifier 420 is shown. Transistors $M_4$ and $M_6$ form a gain loop such that with the two transistors $M_3$ and $M_4$ being equal in size (i.e., matched at a ratio of 1:1), and where transistors $M_1$ and $M_2$ are matched with a ratio of m:1 where m is greater than unity (for example, m is typically set at 4), the drain current $I_{D1}$ of transistor $M_1$ is equal to the drain current $I_{D2}$ of transistor $M_2$. It can be further shown that the drain currents $I_{D1}$, $I_{D2}$ of transistors $M_1$ and $M_2$ are equal according to the following expression.

$$I_{D2} = I_{D1} = \frac{1}{R_{BIAS}}\left(1 - \frac{1}{\sqrt{m}}\right)(V_{GS} - V_T) \qquad (7)$$

Where $V_{GS}$ and $V_T$ are gate-to-source voltage and threshold voltage of the transistors $M_X$. Furthermore, for MOSFETs in saturation, the transconductance gm, and in particular, of transistor $M_2$ in this case, can be expressed as follows:

$$gm_2 = \frac{2I_{D2}}{V_{GS} - V_T} = \frac{2}{R_{BIAS}}\left(1 - \frac{1}{\sqrt{m}}\right) \qquad (8)$$

Therefore, by coupling transistors $M_7$, $M_8$, and $M_9$ of the operational amplifier 420 such that these transistors are related to transistor $M_2$ of the bias circuit 410 through a size multiplier K (where K can be less than unity), the following expression for the transconductances of transistors $M_8$ and $M_9$ can be derived.

$$gm_8 = gm_9 = \frac{K}{R_{BIAS}}\left(1 - \frac{1}{\sqrt{m}}\right) \qquad (9)$$

where $gm_8$ and $gm_9$ are transconductances of transistors $M_8$ and $M_9$ respectively of the operational amplifier 420, and where K provides a ratio between the size of the transistors $M_8$ and $M_9$, and $M_2$.

Given the above relationship, the gain bandwidth product $\omega_u$ of the operational amplifier 420 can be expressed by the following expression.

$$\omega_u = \frac{gm_{8,9}}{C_c} = \frac{K}{R_{BIAS}C_c}\left(1 - \frac{1}{\sqrt{m}}\right) \quad (10)$$

Where $C_C$ is the compensation capacitance located inside the operational amplifier 501 (FIG. 5) which is coupled between the output node $V_{OUT}$ and the gate terminal of transistor $M_{13}$ (FIG. 4). From the above expression, it can be seen from equation (10) that the gain bandwidth product $\omega_u$ of the operational amplifier 420 is dependent upon the resistance $R_{BIAS}$ of the bias circuit 410.

Figure 1:
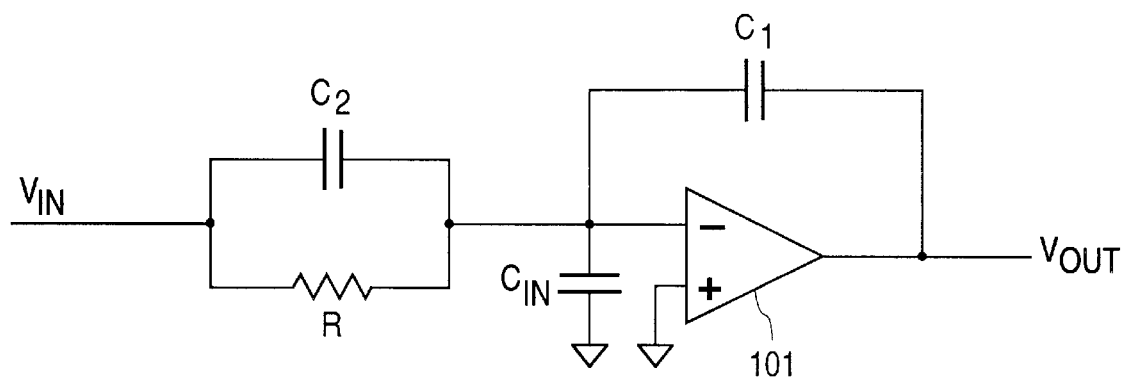
FIG. 1 illustrates a conventional active RC integrator filter with an operational amplifier having a finite gain bandwidth product.
Figure 5:
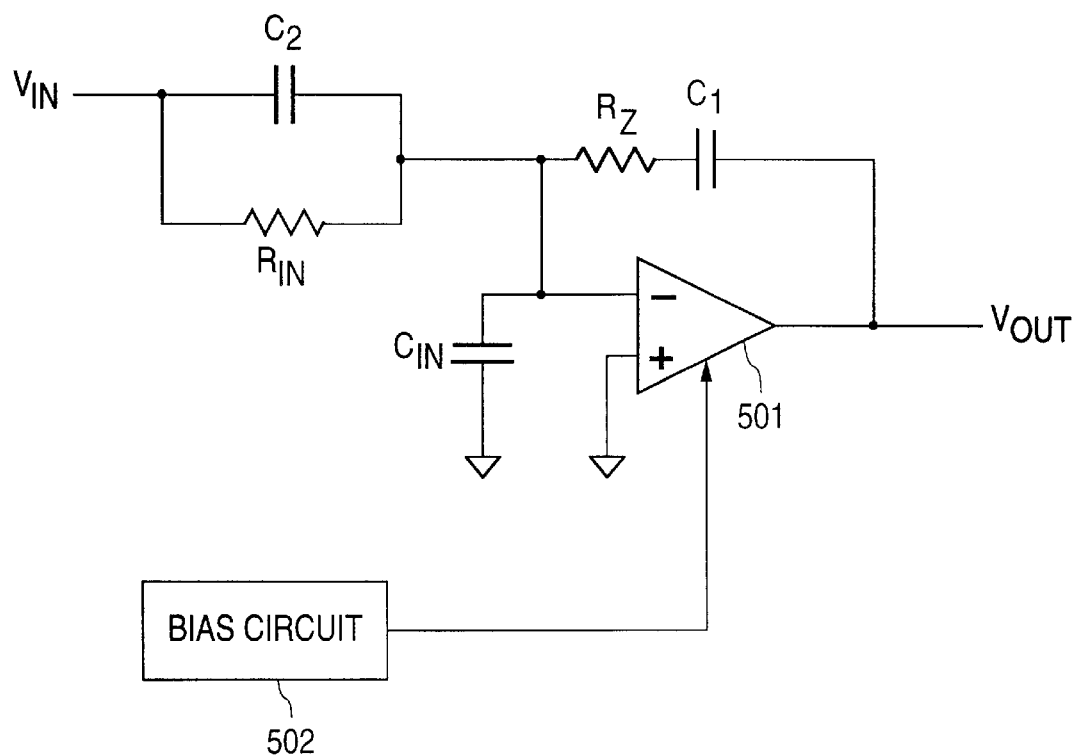
FIG. 5 illustrates one embodiment of the filter according to the present invention.
Figure 2:
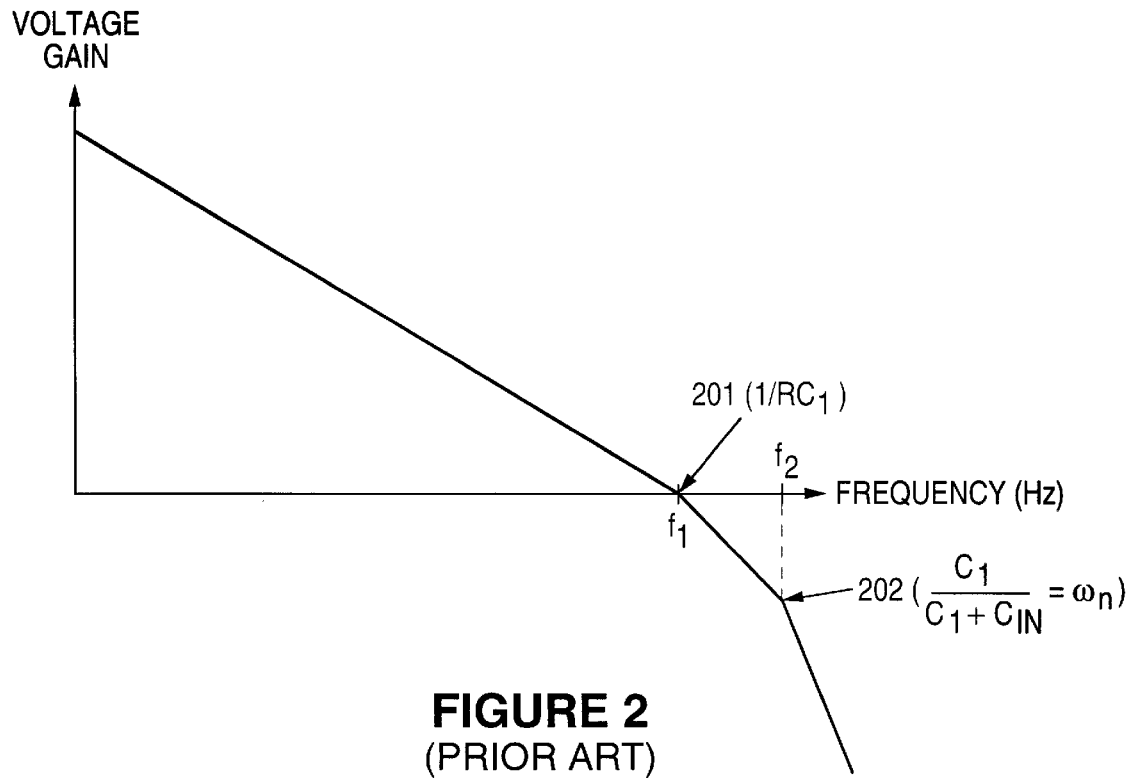
FIG. 2 illustrates the bode plot of the conventional active RC integrator filter of FIG. 1.
Figure 3:
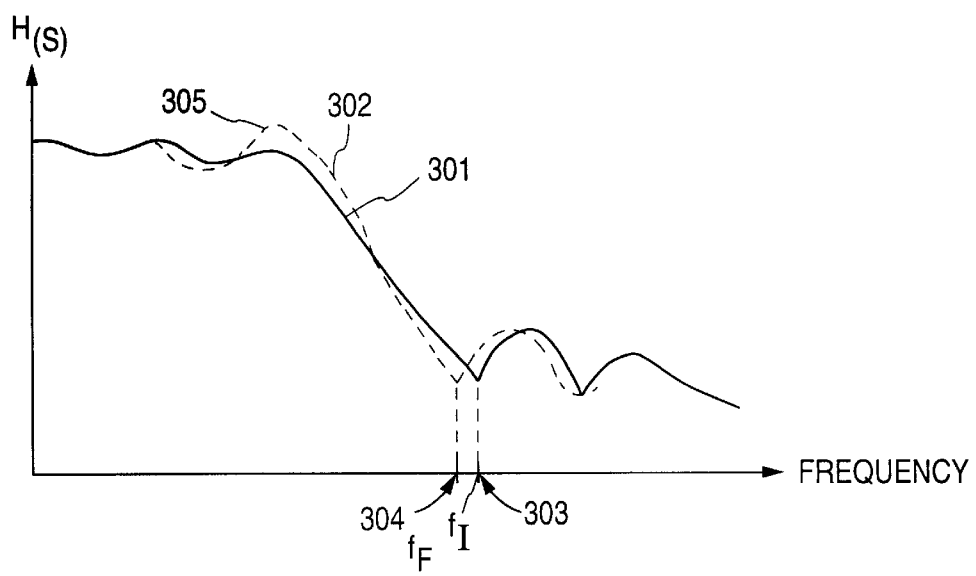
FIG. 3 illustrates the passband edge peaking of the conventional active RC integrator filter of FIG. 1.

Referring to FIG. 5, an active RC integrator filter according to one embodiment of the present invention is shown. There is provided an operational amplifier 501, an integrating capacitor $C_1$, an input capacitor $C_2$, an input resistance $R_{IN}$, an input parasitic capacitance $C_{in}$, and a feedback resistor $R_Z$. In addition, it is shown that the operational amplifier 501 is biased by a bias circuit 502 which has characteristics of the conventional bias circuit 410 of FIG. 4.

As shown in FIG. 5, the feedback resistor $R_Z$ is coupled in series with the integrating capacitor $C_1$. This integrator filter then has a transfer function which can be expressed as follows.

$$\frac{V_{out}}{V_{in}} \cong -(1 + R_z C_1 S) \frac{(R_{IN} C_2 S + 1)}{S\left[\frac{R_{IN}(C_1 + C_2 + C_{in})}{\omega_u}\left(S + \frac{C_1 \omega_u}{C_1 + C_2 + C_{in}}\right)\right]} \quad (11)$$

The non-dominant pole of the integrator filter of FIG. 5 due to the finite operational amplifier gain bandwidth product can be approximately cancelled if the following expression holds.

$$\frac{1}{R_z C_1} \cong \frac{C_1 \omega_u}{C_1 + C_2 + C_{in}} \quad (12)$$

Substituting equation (10) into equation (12), the following expression can be derived.

$$\frac{R_{BIAS}}{R_z} = \frac{K}{C_c}\left(1 - \frac{1}{\sqrt{m}}\right)\left(\frac{C_1}{C_1 + C_2 + C_{in}}\right) \quad (13)$$

From equation (13), it can be seen that the bias resistance $R_{BIAS}$ of the bias circuit 410 (FIG. 4) and the feedback resistance $R_Z$ of the active RC filter are related in a ratio form. Since the bias resistance $R_{BIAS}$ and the feedback resistance $R_Z$ of the filter of the present invention are made from the same material, changes in the bias resistance $R_{BIAS}$ will be reflected in the feedback resistance $R_Z$. Furthermore, as long as the ratio between the bias resistance $R_{BIAS}$ and the feedback resistance $R_Z$ satisfies the criteria of equation (13), the zero will cancel the non-dominant pole.

In the manner described above, a zero can be inserted into the transfer function of an integrator filter such that excess phase shifts resulting in a peak at the pass band edge can be avoided. Furthermore, since the active RC filter according to the present invention is in integrated form, the resistors used in the filter are constructed of the same material as any other resistors used by the overall filter architecture, for example, the bias resistance in the bias circuit used for driving the operational amplifier of the active RC filter.

Figure 6:
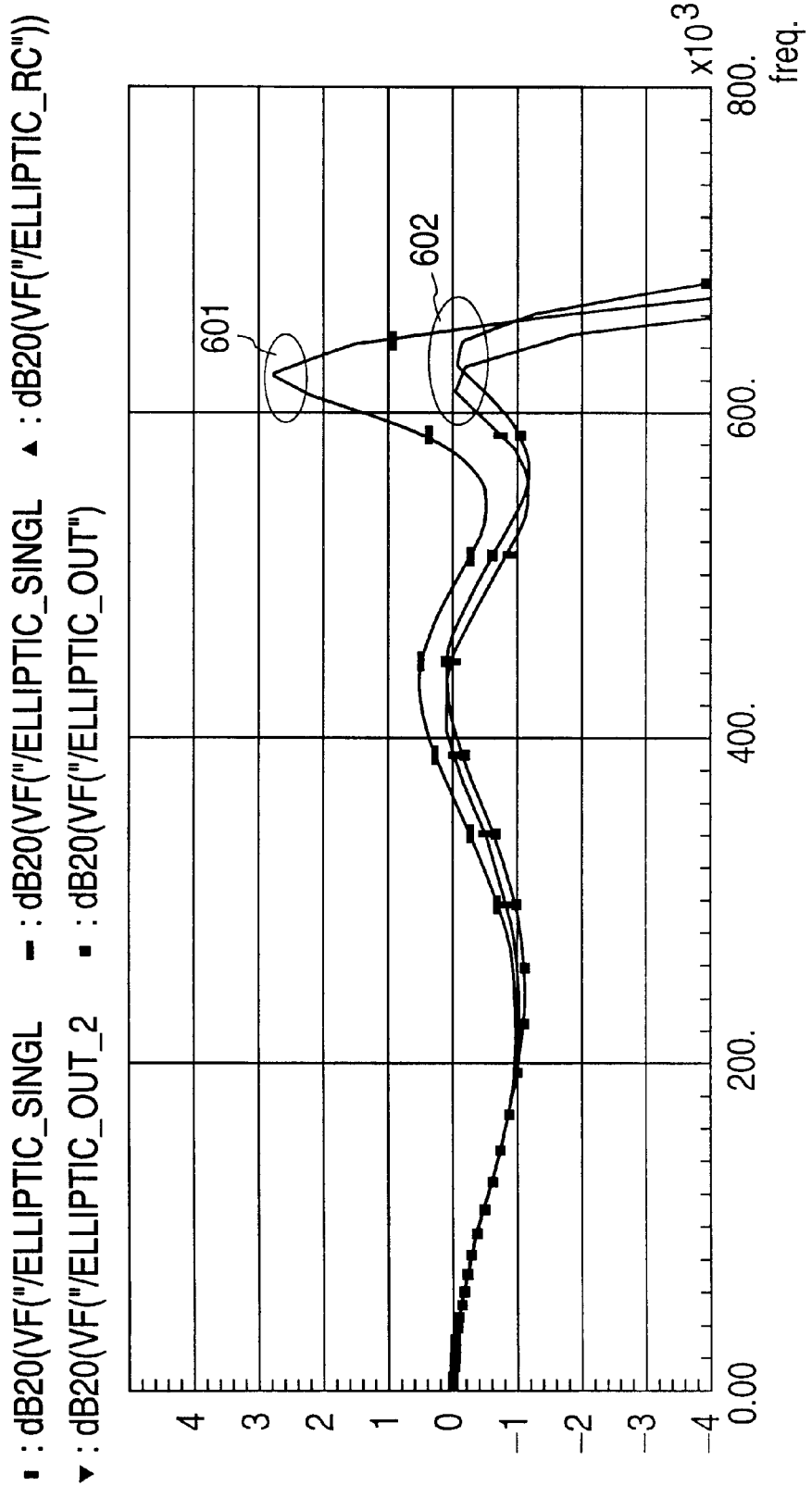
FIG. 6 illustrates a bode plot which shows the effect at the passband edge of the zero insertion in the transfer function of the active RC filter of FIG. 5.

FIG. 6 shows the passband characteristics of the filter according to the present invention as compared with that of the conventional filter 601. From this figure, it can be seen that the passband edge peaking of the conventional filter 601 is substantially reduced in the passband edge 602 of the filter according to the present invention. This reduction is attributed to the feedback resistance $R_Z$ added to the active RC filter which results in the insertion of a zero in the transfer characteristics of the filter. In addition, since the filter is biased in such a way that the feedback resistance $R_Z$ is made to track any operating conditions in the bias resistance such as change in temperature, process, or supply voltage, any of such variations in the operating conditions will be reflected in the filter and, therefore, in the feedback resistance $R_Z$ thereof.

As illustrated above, the finite operational gain bandwidth product results in excess phase at the integrator unity gain frequency. As shown, the present invention describes a technique which causes the operational amplifier gain bandwidth product to track a resistance and a capacitance. The resistor made from the same material (i.e., integrated) and inserted in series with the integrating capacitor creates a zero which cancels the excess phase of the integrator. The relationship of the two resistor values is such that process tracking is achieved. In one application, for example, the apparatus and technique according to the present invention allows the use of lower power op amps (low bandwidth) which require less current (e.g., advantageous in battery operated cellular phones).

Various other modifications and alternations in the structure and method of operations of this invention will be apparent to those skilled in he art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An integrated active integrator filter circuit, said circuit comprising:
   an operational amplifier including an input node, an output node and a biasing node;
   a bias circuit including a first resistaice coupled to said operational amplifier biasing node and configured to provide a bias signal; and
   a feedback circuit including a second resistance and a first capacitance serially coupled between said input and output nodes;
      wherein a ratio of said first and second resistances is selected to a predetermined value for cancelling a non-dominant pole of said filter.

2. The circuit of claim 1 wherein said bias circuit comprises a plurality of transistors such that magnitude of transconductance of at least one of said plurality of transistors is proportional to magnitude of said first resistance.

3. The circuit of claim 1 wherein said input node comprises an inverting input node and said operational amplifier further includes a non-inverting input node, and further wherein said non-inverting input node is coupled to a reference node.

4. The circuit of claim 1 further comprising a second capacitance and a third resistance coupled to said feedback circuit and said input node.

5. The circuit of claim 4, further comprising a third capacitance coupled between said input node and a reference node.

6. A method of providing an integrated active integrator filter circuit, said method comprising the steps of:

providing an operational amplifier including an input node, an output node and a biasing node, providing a bias circuit including a first resistance coupled to said operational amplifier biasing node and configured to provide a bias signal; and providing a feedback circuit including a second resistance and a first capacitance serially coupled between said input and output nodes;

wherein a ratio of said first and second resistances is selected to a predetermined value for cancelling a non-dominant pole of said filter.

7. The method of claim 6 wherein said step of providing said bias circuit includes the step of providing a plurality of transistors such that magnitude of transconductance of at least one of said plurality of transistors is proportional to magnitude of said first resistance.

8. The method of claim 6 wherein said input node includes an inverting input node, said operational amplifier includes a non-inverting input node, and further wherein said non-inverting input node is coupled to a reference node.

9. The method of claim 8 wherein said reference node is further coupled to the ground terminal.

10. The method of claim 6 further including the step of providing a second capacitance and a third resistance coupled to said feedback circuit and said input node.

11. The method of claim 10, further including the step of providing a third capacitance coupled between said input node and a reference node.

12. A filter circuit, comprising:

a filter input terminal;

a filter output terminal;

an operational amplifier having first and second input nodes, an output node and a biasing node, said operational amplifier output node coupled to said filter output terminal;

an input capacitance coupled between said filter input terminal and said operational amplifier first input node;

an input resistance coupled between said filter input terminal and said operational amplifier first input node;

a feedback circuit having a feedback resistance and a first capacitance coupled between said first input node and said output node of said operational amplifier; and a bias circuit including a bias resistance coupled to said operational amplifier biasing node and configured to provide a bias signal;

wherein a ratio of said first and second resistances is selected to a predetermined value for cancelling a non-dominant pole of said filter.

13. The circuit of claim 12 wherein said operating conditions of said filter circuit include variations in temperature.

14. The circuit of claim 12 wherein said bias circuit comprises a plurality of transistors configured such that magnitude of transconductance of at least one of said plurality of transistors is proportional to magnitude of said first resistance.

15. The circuit of claim 14 wherein said first input node is inverting, said second input node is non-inverting, and said second input node is coupled to a reference terminal.

16. The circuit of claim 15 wherein said reference terminal is ground.

17. A method of providing a filter circuit, comprising the steps of:

providing a filter input terminal;

providing a filter output terminal;

providing an operational amplifier having first and second input nodes, an output node and a biasing node, said step of providing said operational amplifier includes the step of coupling said operational amplifier output node to said filter output terminal;

coupling an input capacitance between said filter input terminal and said operational amplifier first input node;

coupling an input resistance between said filter input terminal and said operational amplifier first input node;

coupling a feedback circuit having a feedback resistance and a first capacitance between said first input node and said output node of said operational amplifier; and coupling a bias circuit including a bias resistance to said operational amplifier biasing node and configured to provide a bias signal;

wherein a ratio of said first and second resistances is selected to a predetermined value for cancelling a non-dominant pole of said filter.

18. The method of claim 17 wherein said operating conditions of said filter circuit include variations in temperature.

19. The method of claim 18 wherein said step of coupling said bias circuit includes the step of configuring a plurality of transistors such that magnitude of transconductance of at least one of said plurality of transistors is proportional to magnitude of said first resistance.

20. The circuit of claim 19 wherein said first input node is inverting, said second input node is non-inverting, and said second input node is coupled to a reference terminal.

* * * * *

UNITED STATES PATENT AND TRADEMARK OFFICE
CERTIFICATE OF CORRECTION

PATENT NO.: 5,929,699
DATED: July 27, 1999
INVENTOR(S): Laurence Douglas Lewicki It is certified that errors appear in the above-identified patent and that said Letters Patent is hereby corrected as shown below:

In Col. 6, line 42, delete "resistaice" and replace with --resistance--.

In Col. 7, line 2, delete the second occurrence of "," and replace with --;--.

Signed and Sealed this

Seventh Day of December, 1999

Attest:

Q. TODD DICKINSON

Attesting Officer

Acting Commissioner of Patents and Trademarks